United States Patent [19]

Chevion et al.

[11] Patent Number: 4,989,000
[45] Date of Patent: Jan. 29, 1991

[54] DATA STRING COMPRESSION USING ARITHMETIC ENCODING WITH SIMPLIFIED PROBABILITY SUBINTERVAL ESTIMATION

[76] Inventors: Dan S. Chevion, 43 Hantke Street, Haifa 34608; Ehud D. Karnin, 3/25 Alon Street; Eugeniusz Walach, 1 Ciegel Street, both of Kiryat Motzkin 26418, all of Israel

[21] Appl. No.: 368,473

[22] Filed: Jun. 19, 1989

[30] Foreign Application Priority Data

Jul. 5, 1988 [IL] Israel ........................... 86993

[51] Int. Cl.$^5$ ............................................. H03M 7/30
[52] U.S. Cl. ...................................... 341/107; 341/87; 341/95; 341/60
[58] Field of Search ........................ 341/50, 51, 52, 53, 341/59, 60, 67, 87, 95, 106, 107

[56] References Cited

U.S. PATENT DOCUMENTS

| | | |
|---|---|---|
| 4,122,440 | 10/1978 | Langdon, Jr. et al. ............... 341/51 |
| 4,286,256 | 8/1981 | Langdon, Jr. et al. ............... 341/107 |
| 4,467,317 | 8/1984 | Langdon, Jr. et al. ............... 341/107 |
| 4,516,246 | 5/1985 | Kenemuth ............................. 341/67 |
| 4,652,856 | 3/1987 | Mohiuddin et al. .................. 341/60 |
| 4,791,403 | 12/1988 | Mitchell et al. ...................... 341/51 |

Primary Examiner—William M. Shoop, Jr.
Assistant Examiner—H. L. Williams

[57] ABSTRACT

An improved method of generating a compressed representation of a source data string, each symbol of which is taken from a finite set of m+1 symbols, $a_0$ to $a_m$. The method is based on an arithmetic coding procedure wherein the source data string is recursively generated as successive subintervals within a predetermined interval. The width of each subinterval is theoretically equal to the width of the previous subinterval multiplied by the probability of the current symbol. The improvement derives from approximating the width of the previous subinterval so that the approximation can be achieved by a single SHIFT and ADD operation using a suitable shift register.

11 Claims, 3 Drawing Sheets

DATA STRING COMPRESSION USING ARITHMETIC ENCODING WITH SIMPLIFIED PROBABILITY SUBINTERVAL ESTIMATION

FIELD OF THE INVENTION

This invention relates to a method of generating a compressed representation of a source data string. By "compression" is meant reducing the amount of data associated with the source data string without reducing its information content so that output data may be constructed having a lower data content than the original source data, while still permitting the source data in its entirety to be reconstructed. In particular, the invention relates to a method for high efficiency, multiplication-free arithmetic coding. Arithmetic coding is a technique which is commonly employed in order to compress data in data processing systems.

BACKGROUND OF THE INVENTION

Such compression is rendered possible by the high degree of intercorrelation and nonuniform statistical distribution associated with the symbols usually characterizing large data bases. When the source data is represented in digital form, the object of compression is to produce an output string of data having fewer data bits than the original source data string. When a statistically significant sample of source data strings is compressed, the expected length of the compressed output data string corresponds to the "entropy" of the source data string.

One way to achieve compression of source data is by means of the arithmetic coder developed by Jorma Rissanen and first published in an article entitled "Generalized Kraft Inequality Arithmetic Coding", IBM Journal of Research and Development, Vol. 20, No. 3, May 1976. The arithmetic coding procedure introduced by Rissanen permits the compression of multi-alphabet data, i.e., data each of whose symbols may be found within a multi-symbol alphabet.

In order to employ an arithmetic coding procedure, it is first necessary to determine the probability of occurrence for each symbol within the source alphabet. Typically, the probabilities will vary from one source data string to another, so that if, for example, an arithmetic coding procedure is being used to compress the data corresponding to a television image, the probabilities of occurrence for each picture element must first be determined. This may be determined in real time or, alternatively, may be predetermined statistically. However, the actual method for determining these probabilities is not a feature of the present invention which is equally applicable regardless of how the probabilities are determined.

Having determined the probabilities of occurrence for each different symbol within the source alphabet, the cumulative probability for each symbol may then be determined. Thus, the cumulative probability $S(1)$ for the first symbol of the data string will be equal to zero and, in general, the cumulative probability $S(n)$ for the nth symbol will be equal to the sum of the probabilities of occurrence for each of the preceding $n-1$ symbols.

Arithmetic coding procedures normally represent the output data string as a binary fraction within the unit interval (0,1). As explained by G. Langdon in "An Introduction to Arithmetic Coding", IBM Journal of Research and Development, Vol. 28, No. 2, Mar. 1984, arithmetic coding is related to the process of subdividing the unit interval. This subdivision is achieved by marking along the unit interval code points $C_n$ for each symbol within the source alphabet, each code point being equal to the sum of the probabilities of occurrence of the preceding symbols. The width or size $A_n$ of the subinterval to the right of each code point represents the probability of occurrence of the source data string up to the corresponding symbol (FIG. 1).

Consider, for example, a source data string whose alphabet comprises symbols $a_0$ to $a_m$, having probabilities of occurrence equal to $p(0)$ to $p(m)$, respectively. If the source data string is a $a_0 a_5 a_3 \ldots$, then the first symbol $a_0$ will be encoded within the subinterval $(0,p(0))$. This represents a first subinterval within the original unit interval whose width $A_1$ is equal to $p(0)$ corresponding simply to the probability of occurrence of symbol $a_0$. In order to encode the second symbol $a_5$ of the source data string, its probability of occurrence, conditional on the probability of symbol $a_0$ occurring, must be determined. Furthermore, the cumulative probability $S(5)$ associated with the second symbol $a_5$ must be calculated. Thus, the subinterval corresponding to the second symbol $a$ is a second subinterval within the first subinterval corresponding to $a_0$. Mathematically, the width $A_2$ of the second subinterval is equal to $p(0)*p(5)$, i.e., the product of the probabilities of occurrence of both symbols $a_0$ and $a_5$. The starting point of the second subinterval within the unit interval depends on the width $A_1$ of the first subinterval and the cumulative probability $S(5)$ associated with the second symbol $a$ being equal to their product $A_1*S(5)$.

Thus, as each symbol of the source data string is successively encoded within the unit interval, a succession of subintervals is generated, each of which may be specified in terms of a specific code point and width. The code point for the current subinterval corresponds to the start of the current subinterval within the previous interval or subinterval. As explained above, this is equal to the cumulative probability associated with the current symbol. Thus, the code point associated with the nth subinterval will be equal to the width of the n-1th subinterval multiplied by the cumulative probability of the preceding $n-1$ symbols, i.e., $A_n S(n)$. The width of the new subinterval itself will be equal to the product of the probabilities of all symbols (including the current one) so far encoded, i.e., $p(0)*p(5)*p(3) \ldots$, for the above source data string. The data corresponding to the width $A_n$ and code points $C_n$ of the nth subinterval thus encode the first $n+1$ symbols in the source data string. Arithmetic coders therefore require two memory registers, usually called the A and C registers, for storing these data.

Since the width of the subinterval is equal to a product of probabilities, two factors emerge. First, as more symbols of the source data string are encoded, the width of the subinterval defining the arithmetic code representation will decrease (since each individual probability must necessarily be smaller than 1); and, furthermore, the process of arithmetic coding requires a succession of multiplication operations for its effective implementation.

Although arithmetic coders produce optimum compression corresponding to the entropy of the source data string, when based on the exact probabilities of occurrence of the symbols constituting the data string, prior implementations of arithmetic coding procedures have tended to introduce approximations on account of the difficulty in determining the exact probabilities Such approximations reduce the efficiency of the arithmetic coding operation and result in an output data string being generated which has more symbols than the theoretical minimum, or entropy. Moreover, further approximations have been introduced in order to eliminate the multiplication operation, which is required for determining the width of each successive subinterval.

Arithmetic coders are implemented on computers whose memory registers contain a finite number of bits. One problem associated with multiplication results from the fact that, since the successive multiplication of probabilities always produces smaller and smaller intervals, after only a few such multiplications the resulting subinterval may be too small to be satisfactorily stored in the computer register. For example, if each register has 16 bits and the multiplication of successive probabilities results in a number smaller than $2^{-16}$, this number will underflow the register. In other words, the register will be full of zeros, the significant bits of the probability product being lost. A further problem associated with successive multiplication operations is the time taken for these to be implemented.

The first of the above drawbacks has been solved using a technique called normalization, whereby the probability product is stored in floating point notation. In order to do this, a further bit register is employed for storing the exponent (to base 2) for the width of the subinterval when the most significant 1 of the binary fraction is shifted to the extreme leftmost position Thus, the binary fraction $1.0101 \times 2^{-20}$ which clearly cannot be stored in a 16-bit register, may satisfactorily be stored as 1.0101E-20, wherein the mantissa and the exponent are stored in separate registers. Since the most significant bit of the mantissa is thus arranged always to be 1, the actual number stored in the mantissa register will always be greater than 1.0.

The second problem described above and related to the time taken to perform multiplication operations has to some extent been solved by the implementation of so-called "multiplication-free" arithmetic coders. In computers which employ binary arithmetic, multiplication is implemented as a series of SHIFT and ADD operations. The term "multiplication-free" has variously been used in the prior art to imply either a single SHIFT or a single SHIFT and ADD operation for each coding step. Strictly speaking, mathematically even a single SHIFT operation constitutes multiplication. However, this is many orders of magnitude less time consuming than the multiplication operations associated with precise implementations of arithmetic coders involving multiple SHIFT and ADD operations. Thus, "multiplication-free" is often used to denote that multiplication operations are significantly simplified or reduced. It is in this context that "multiplication-free" has been used in the prior art and is used in the present invention.

Langdon et al., U.S. Pat. No. 4,286,256, "Method and Means for Arithmetic Coding Utilizing a Reduced Number of Operations", issued Aug. 25, 1981, simplify the multiplication operation by truncating one of the inner products corresponding to the width of the subinterval prior to encoding the current codepoint. However, Langdon's method is suitable only for binary sources (i.e., alphabets containing only two symbols), wherein it is possible to encode each symbol of the source data string either as a more probable or less probable event. This procedure is unsuitable for multi-alphabet codes.

Mohiuddin et al., U.S. Pat. No. 4,652,856, "Multiplication-free Multi-alphabet Arithmetic Code", issued Mar. 24, 1987, disclose an arithmetic code in which each subinterval is stored in floating point format, as explained above, such that the mantissa stored within the A register is a binary fraction greater than 0.1. In accordance with the approximation proposed by Mohiuddin, a variable criterion is adopted which either truncates the mantissa of the subinterval to exactly 0.1 (binary) or, alternatively, rounds it up to 1. Such an approximation still achieves the desired compression, but at a loss of efficiency. In other words, more bits than the minimum are required for representing the compressed data string. The inefficiency associated with Mohiuddin's procedure depends on the nature of the source data being compressed.

The major drawback with Mohiuddin results from the fact that rounding up the contents of the A register approximates the probability of the corresponding symbol to a value greater than its actual value. In order to ensure that the sum of the probabilities for all symbols in the alphabet cannot exceed 1.0, Mohiddiun approximates the last subinterval to $$A(m) = 1 - \sum_{i=0}^{m-1} p(i)$$

While this approximation ensures that the sum of the probabilities of all symbols in the alphabet is equal to 1, it can achieve this at the expense of rendering the last subinterval so small that the coding is highly inefficient.

SUMMARY OF THE INVENTION

It is an object of this invention to provide a method for high efficiency, multiplication-free arithmetic coding wherein the disadvantages associated with prior art methods are significantly reduced or eliminated.

According to the invention, there is provided a method of generating a compressed representation R(comp) of a source data string STR, wherein:
each symbol is taken from a finite set of m+1 symbols $a_0 \ldots a_m$,
said compressed representation being a numeric value within a given range and being generated recursively in successive cycles for successive symbols in the string,
a probability value p(i) and a cumulative probability value S(i) being available for each symbol $a_i$,
said cumulative probability value being $$S(i) = p(0) + p(1) + \ldots + p(i - 1) \text{ for } i = 1 \ldots m,$$
$$S(0) = 0,$$

and using a pair of shift registers A and C, each comprising $\omega$ binary digit positions,
the improvement comprising the steps of:
(a) initially setting the contents of the C register to all zeros and the contents of the A register to a predetermined value; and
for each successive symbol $a_i$ in the string:
(b) determining a scaling factor K by taking the contents of the A register and eliminating all binary digits less significant than a predetermined binary one digit;

(c) adding the value K*S(i) to the contents of the C register;
(d) determining the contents of the A register:
  (d1) if the symbol $a_i$ is not the symbol $a_m$ by inserting the value K*p(i) into the A register, or
  (d2) if the symbol $a_i$ is the symbol $a_m$, by subtracting the value K*S(i) from the contents of the A register;
(e) shifting both the A register and the C register in a predetermined direction until the contents of the A register lie within a predetermined range, filling the vacated positions with zeros; and
(f) if the symbol $a_i$ is not the last symbol in string STR, repeating steps (b)–(e) or, if the symbol $a_i$ is the last symbol in string STR, shifting the contents of the C register by $\omega$ positions in said predetermined direction;
whereby the sequence of binary digits shifted out of the C register constitutes said compressed representation R(comp) of the symbol string STR.

Thus, in accordance with the invention, each symbol within the source data string STR is successively coded, the representative compressed code thereof being shifted out of the C register for post-processing as required. Typically, the compressed data which is successively read from the C register is transmitted to a suitable decoder which decodes the compressed string so as to reconstruct the original source data string STR. In common with the prior art arithmetic encoders referred to above, the method according to the invention is a first-in/first-out (FIFO) routine, whereby the first symbol in the source data string STR is also the first symbol to be encoded.

In a preferred embodiment, the A register is initialized to a value of 1.000, the compressed arithmetic code then being a value between 0 and 1.

Since each symbol within the source data string STR is encoded successively, it may occur that the code developed for subsequent symbols of the source data string STR will affect the code already generated for a previous symbol, owing to the effect of "carry over". The effect of carry over is well known in the literature. Several solutions to the problem have been published, any one of which may suitably be used in conjunction with the proposed invention.

BRIEF DESCRIPTION OF THE DRAWINGS

The invention will now be described with regard to a method for generating a compressed representation R(comp) of a source data string STR, each symbol of which is taken from a finite set of m+1 symbols, and with reference to the accompanying drawings.

DETAILED DESCRIPTION OF THE PREFERRED EMBODIMENT

Figure 1:
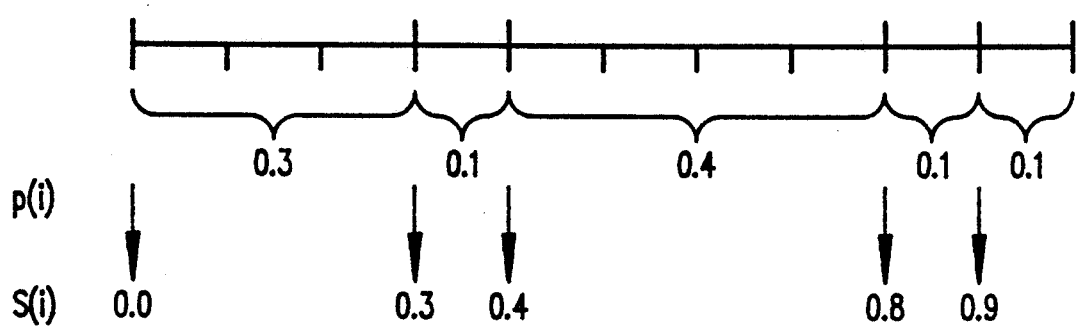
FIG. 1 illustrates, for an example of an ordered symbol set comprising five symbols, the probabilities and the resulting cumulative probabilities.

FIG. 1 shows a table of probabilities p(i) and resulting cumulative probabilities S(i) for an ordered symbol set comprising five symbols, $a_0$ to $a_4$, together with the corresponding code points $C_n$ plotted on the unit interval (0,1). As explained above, the process of recursively encoding successive symbols of a symbol set as a subinterval within the unit interval from the probabilities p(i) and the cumulative probabilities S(i) for the symbol $a_i$ to be encoded, is a characteristic feature of arithmetic coding procedures per se.

Figure 2:
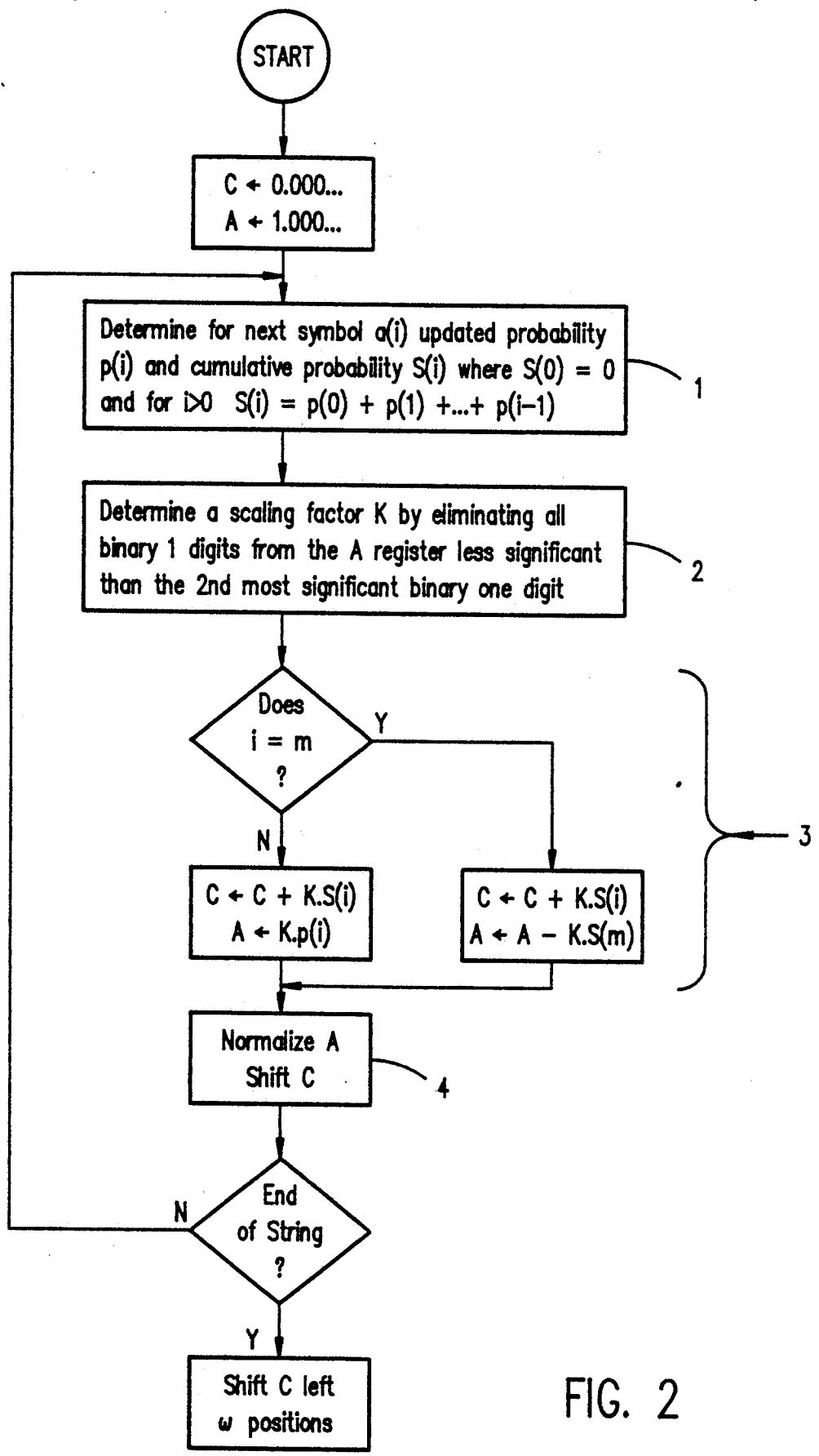
FIG. 2 is a flow diagram showing a coding procedure according to the invention.

Referring now to FIG. 2, there is shown a flow diagram of an encoding procedure according to the invention. The four main steps of the procedure are numbered (1)–(4), inclusive, for reasons which will become apparent below with reference to FIG. 3 of the drawings.

It is seen that at the start of the procedure, the C register is set to 0.000 and the A register is set to 1.000. In step (1), the probability p(i) and cumulative probability S(i) are determined for each symbol $a_i$ in the source data string STR. This can be done using any one of several known procedures. Alternatively, a fixed, predetermined set of probability values may be employed. A scaling factor K is then determined, as shown in step (2), by taking the contents of the A register and eliminating all binary digits less significant than the second most significant binary 1 digit. The A register represents the width of the current subinterval, the scaling factor K being, in effect, an approximation of the width of the current subinterval. This width is normalized between 1.0000 (binary) and 1.1111..., and the scaling factor K is merely an approximation for the value of the A register, eliminating all ones less significant than the second.

In the description which follows, the symbols of the finite set of m+1 symbols are designated as $a_0, a_1, \ldots, a_m$. The probability and cumulative probability for the symbol $a_i$ is designated p(i) and S(i), respectively. Thus for example, if the eighth symbol of the multi-symbol alphabet is "h", then $a_8 = h$ and the respective probabilities are p(8) and S(8).

Step (3) shows that for each symbol in the source data string STR, the product of K and S(i) is added to the C register, and the A register is set to the product K*p(i) if i<m and is reduced by the product K*S(m) if i=m. Thus, where the current symbol to be encoded does not correspond to the last symbol $a_m$ within the multi-symbol alphabet, the A register is set simply to the probability of the current symbol times K, being an approximation for the width of the current subinterval. On the other hand, when the current symbol to be encoded corresponds to the last symbol of the alphabet, the value of the A register is reduced by the product of K times the cumulative probability of the last symbol of the alphabet. This compensates for the fact that the probabilities p(i) are only approximate and, in effect, ensures that the sum of the probabilities of all the symbols in the multi-symbol alphabet is equal to 1. This follows since for the mth symbol of the alphabet: A←A−K*S(m), and since K is an approximation for A: A←A−A*S(m).

Thus, $A \leftarrow A(1 - S(m))$, i.e., $A \leftarrow A(1 - p(0) + p(1) + \ldots + p(m-1))$, i.e., $A \leftarrow A*p(m)$, which is exactly what is required.

Step (4) in the algorithm is to normalize the A register so that its contents lie within a predetermined range. In order to do this, the contents of the A register are multiplied by an appropriate multiple of 2. This is achieved by a simple SHIFT operation by means of which the contents of the A register are shifted left by a specified number of bits, depending on the present contents of the A register. The C register is then shifted left by the same number of bits, the most significant bits thereof being read from the C register and constituting part of the arithmetic code for the source data string STR. This procedure is repeated for all symbols in the source data string STR and, on completion, the complete contents of the C register are shifted out of the C register and concatenated to the previously generated code string, the resulting code string representing the compressed output data string.

It will thus be seen that the method according to the invention generates a compressed output data string recursively for each symbol within the source data string STR. As the code is generated, it is shifted out of the C register while, at the same time, normalizing the A register.

The method according to the invention will perhaps best be understood with reference to the following example.

EXAMPLE

A source data string is to be derived from a 5-symbol alphabet having symbols $a_0$ to $a_4$ equal to a,b,c,d,e, respectively, with probabilities (in binary) as follows:

| | |
|---|---|
| p(0) = | 0.000001 |
| p(1) = | 0.000011 |
| p(2) = | 0.000110 |
| p(3) = | 0.001010 |
| p(4) = | 0.101100 |

Thus, the number of symbols m+1 in the multi-system alphabet is equal to 5, and it may be verified that the sum of the probabilities is equal to one, i.e:

$$\sum_{i=0}^{4} p(i) = 1$$

The cumulative probabilities for each symbol are as follows:

| | |
|---|---|
| S(0) = | 0.000000 |
| S(1) = | 0.000001 |
| S(2) = | 0.000100 |
| S(3) = | 0.001010 |
| S(4) = | 0.010100 |

Using the method in accordance with the preferred embodiment as described above, encode the source data string given by: STR=b,c,e,d,a,c,b, in conjunction with 6-bit A and C registers.

Proceed as follows: initialize the A register to 1.00000 and the C register to 0.000000.

It will be appreciated that the binary point is understood, the actual contents of the A and C registers being 100000 and 000000, respectively.

Encode first symbol b ($=a_1$):

| | |
|---|---|
| K = 1, | i = 1 ≠ m |
| p(1) = 000011 | S(1) = 000001 |
| C = 0.0 + 1.0 × 0.000001 = 0.000001 | | giving:

| A | C |
|---|---|
| .000011 | .000001 |

Normalize A and shift C:

| A | C |
|---|---|
| 1.10000 | 00000.100000 | where the binary point denotes the boundary of the C register. Thus, the five binary bits 00000 to the left of the binary point denote the first five bits of the resultant arithmetic code shifted out of the C register, while the six binary bits 100000 to the right of the binary point denote the new contents of the C register. Note that the contents of both the A and C registers are right-packed with zeros after the corresponding left shifts. Since the symbol is not the end of the string STR, processing continues.

Encode second symbol c ($=a_2$):

| | |
|---|---|
| K = 1.1 | i = 2 ≠ m |
| p(2) = 000110 | S(2) = 000100 |
| C = 0.100000 + 1.1 × 0.0001 = 0.10011 | | giving:

| A | C |
|---|---|
| .001001 | 00000.100110 |

Normalize A and shift C:

| A | C |
|---|---|
| 1.00100 | 00000100.110000 |

Since this symbol is not the end of the string STR, processing continues.

Encode third symbol e ($=a_4$):

| | |
|---|---|
| K = 1.001 | i = 4 = m |
| p(4) = 101100 | S(4) = 010100 |

Since C>1, the leading 1 generates carry-over, giving:

| A | C |
|---|---|
| .110010 | 00000101.000110 |

Normalize A and shift C:

| A | C |
|---|---|
| 1.10010 | 000001010.001100 |

Since this symbol is not the end of the string STR, processing continues.

Encode fourth symbol d ($=a_3$):

| | |
|---|---|
| K = 1.1 | i = 3 ≠ m |

$$p(3) = 001010 \quad\quad S(3) = 001010$$
$$C = 0.001100 + 1.1 \times 0.00101 = 0.011011$$

giving:

| A | C |
|---|---|
| .001111 | 000001010.011011 |

Normalize A and shift C:

| A | C |
|---|---|
| 1.11100 | 000001010011.011000 |

Since this symbol is not the end of the string STR, processing continues.

Encode fifth symbol a ($=a_0$):

$$K = 1.1 \quad\quad i = 0 \neq m$$
$$p(0) = 000001 \quad\quad S(0) = 000000$$
$$C = 0.011000 + 0.0 = 0.011000$$

giving:

| A | C |
|---|---|
| .000001 | 000001010011.011000 |

Normalize A and shift C:

| A | C |
|---|---|
| 1.00000 | 0000010100110111000.000000 |

Since this symbol is not the end of the string STR, processing continues.

Encode sixth symbol c ($=a_2$):

$$K = 1.0 \quad\quad i = 2 \neq m$$
$$p(2) = 000110 \quad\quad S(2) = 000100$$
$$C = 0.0 + 1.0 \times 0.000100 = 0.000100$$

giving:

| A | C |
|---|---|
| .000110 | 0000010100110111000.000100 |

Normalize A and shift C:

| A | C |
|---|---|
| 1.10000 | 00000101001101110000001.000000 |

Since this symbol is not the end of the string STR, processing continues.

Encode seventh symbol b ($=a_1$):

$$K = 1.1 \quad\quad i = 1 \neq m$$
$$p(1) = 000011 \quad\quad S(1) = 000001$$
$$C = 0.0 + 1.1 \times 0.000001 = 0.000001$$

giving:

| A | C |
|---|---|
| .000100 | 00000101001101110000001.000001 |

Normalize A and shift C:

| A | C |
|---|---|
| 1.00000 | 000001010011011100000010000.010000 |

Since this is the last symbol in the string STR, now shift the contents of the C register left six places to produce the complete output string:
$$C = 000001010011011100000010000010000$$

Figure 3:
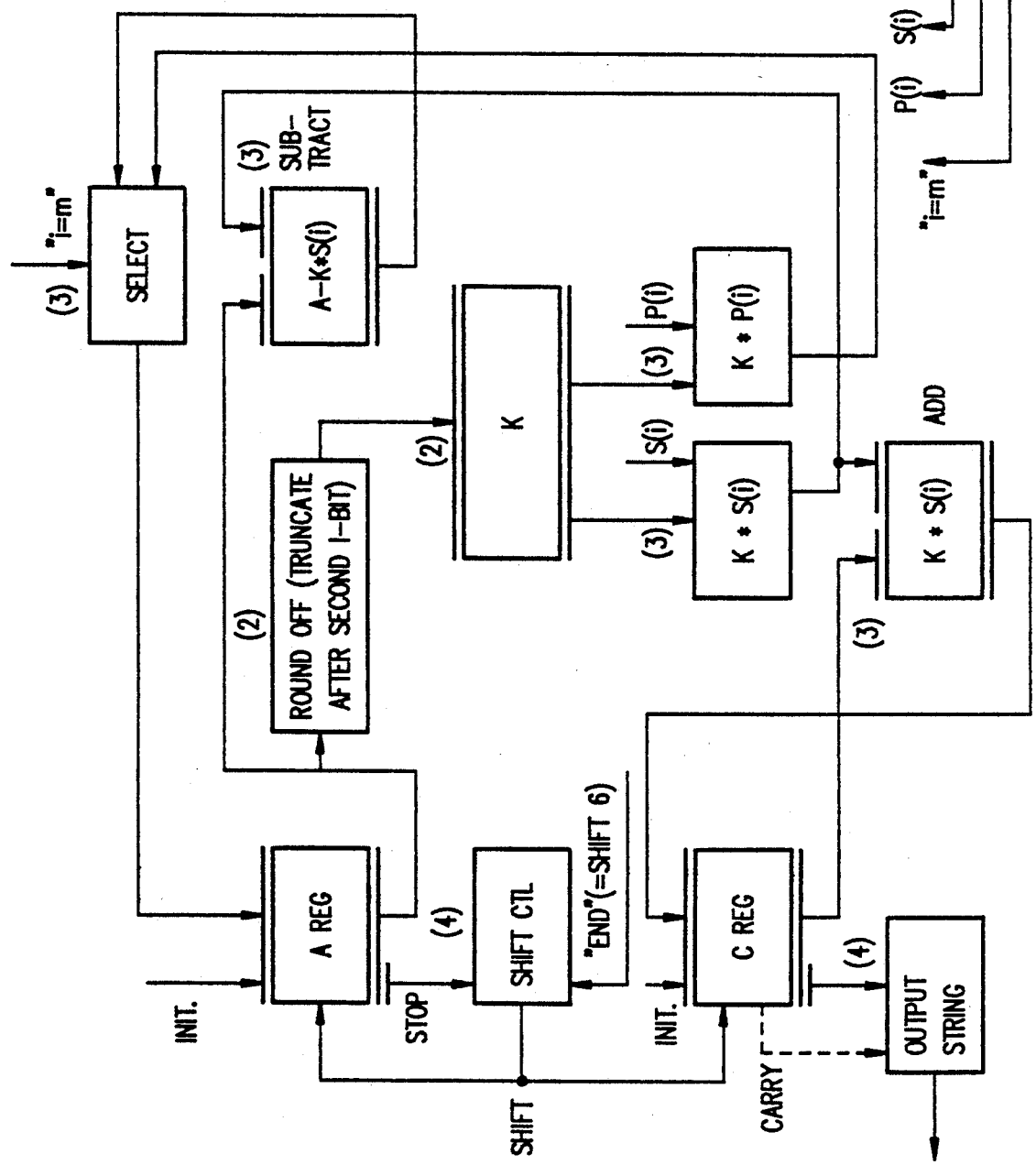
FIG. 3 relates to FIG. 2 and illustrates the flow of data between registers when performing the coding procedure according to FIG. 2.

FIG. 3 shows the flow of data between the registers for each of the steps (1)–(4) of the procedure described above with reference to FIG. 2.

Thus, during step (1) of the encoding procedure, each symbol $a_i$ in turn is extracted from the INPUT string, a flag "END" being generated to indicate whether or not the symbol $a_i$ is the last symbol in the INPUT string. The symbol $a_i$ is input to a TABLE OF PROBABILITIES which may constantly be updated so as to derive therefrom the probabilities $p(i)$ and $S(i)$. A flag "i=m" is also generated and indicates whether or not the symbol $a_1$ corresponds to the last symbol of the source alphabet.

During step (2), the contents of the A register are truncated in order to provide the scaling factor K.

During step (3), the values of $p(i)$ and $S(i)$ are multiplied by the value of K derived in step (2) using a single SHIFT and ADD operation, generating the values $K*p(i)$ and $K*S(i)$, respectively, which are stored in temporary buffers as shown. The values of A and $K*S(i)$ are fed to a SUBTRACTOR whose output is equal to $A-K*S(i)$. Likewise, the values of C and $K*S(i)$ are fed to an ADDER whose output is equal to $C+K*S(i)$. The output $A-K*S(i)$ from the SUBTRACTOR and the value of $K*p(i)$ are fed to a SELECT logic unit together with the value of the flag "i=m". The output from the SELECT unit is equal to $K*p(i)$ if i≠m, and to $A-K*S(i)$ if i=m.

Finally, during step (4) a SHIFT CONTROL unit shifts the A and C registers until the contents of the A register lie within a specified range, when a STOP flag is generated, thereby stopping the SHIFT operations. The "END" flag derived from step (1) is fed to the SHIFT CONTROL unit, so that at the end of the INPUT string, the SHIFT CONTROL unit shifts the C register six places (6-bit A and C registers being employed), thereby emptying the C register. As the C register is shifted by the SHIFT CONTROL unit in response to the STOP or END flags, the data shifted out of the C register are concatenated in order to produce the OUTPUT STRING. Where required, a CARRY bit is also concatenated to the OUTPUT STRING, as explained with reference to FIG. 2 and the detailed example above.

Note that in the example just described, the A register is normalized such that it always lies within the range 1.0 to 2.0, i.e., $A \in (1,2)$. It will readily be understood that the A register could be normalized between 0.1 and 1.0 (binary), or any multiple of 2 thereof by employing exactly the same algorithm but dividing the probabilities by appropriate multiples of 2 (or multiplying them by appropriate multiples of the binary number 0.1). Furthermore, in the particular example shown, carryover occurs when encoding the third symbol of the source data string STR. In the example shown, it is assumed that the resultant code is transmitted to the decoder only when all the symbols of the source data string STR have been encoded. Obviously, in practice it is desired to transmit the compressed code in real time as it is generated, rather than storing the concatenated string as it is shifted out of the C register and transmitting it only when the complete source data string STR has been encoded.

If desired, the invention may be employed within a modified method wherein the approximation effected to K is slightly more refined. Thus, if instead of truncating the A register after the second binary 1, it is truncated after the third binary 1, the method can still be employed at the price of a second SHIFT and ADD operation. Obviously, this refinement can be extended even further such that in the limit the scaling factor K is exactly equal to the contents of the A register. This represents unapproximated arithmetic coding. In practice, however, the method described with reference to the Figure achieves greater than 98 percent efficiency while approximating the contents of the A register as explained.

The process of decoding a compressed output data string as derived in accordance with the principles of the invention is essentially the reverse of encoding. Thus, initially the A register is filled with one (1.000 . . .) and the C register is filled with the first six symbols of the compressed string R(comp).

Each symbol of the source data string STR is now decoded successively by determining the largest value of j such that $C > K*S(j)$, where K and S(j) are the same as defined above with respect to the encoder. Having thus determined j, the current symbol is $a_j$, where $a_0 \ldots a_m$ is the multi-symbol alphabet defined above.

The value of $K*S(j)$ is next subtracted from the contents of the C register, while the A register is modified according to whether or not j=m. If j≠m, then the value of $K*p(j)$ is inserted into the A register. On the other hand, if j =m, then the value of $K*S(j)$ is subtracted from the contents of the A register.

Finally, the A and C registers are shifted in a predetermined direction until the contents of the A register lie with the range $A \in (1,2)$. The vacated positions in the A register are filled with zeros, and those in the C register are filled with the corresponding number of most significant digits remaining in the compressed data string R(comp), the complete process being repeated until the compressed data string R(comp) is empty.

We claim:

1. A method for generating a compressed representation of a source data string, each symbol of said string being selected from a finite set of symbols, comprising the steps of:
    (a) generating said compressed representation by Rissanen arithmetic encoding of said source symbols, said Rissanen encoding including generating for each symbol an arithmetic representation of a successive subinterval within a predetermined interval, the width of each subinterval being equal to the width of the previous subinterval weighted by the currently encoded symbol's frequency of occurrence; and
    (b) approximating the width of said previous subinterval with a single SHIFT and ADD operation.

2. In a method of generating a compressed representation R(comp) of a source symbol data string STR, wherein:
    each source symbol is taken from a finite set of m+1 symbols $a_0 \ldots a_m$,
    said compressed representation being a numeric value within a given range and being generated recursively in successive cycles for successive symbols in the string,
    a probability value p(i) and a cumulative probability value S(i) being available for each symbol $a_i$,
    said cumulative probability value being $$S(i) = p(0) + p(1) + \ldots + p(i-1) \text{ for } i = 1 \ldots m,$$
$$S(0) = 0,$$

and using a pair of shift registers A and C each comprising ω binary digit positions,
the improvement comprising the steps of:
    (a) initially setting the contents of the C register to all zeros and the contents of the A register to a predetermined value; and
    for each successive symbol $a_1$ in the string:
    (b) determining a scaling factor K by taking the contents of the A register and eliminating all binary digits less significant than a predetermined binary one digit;
    (c) adding the value $K*S(i)$ to the contents of the C register;
    (d) determining the contents of the A register
        (d1) if the symbol a is not the symbol $a_m$ by inserting the value $K*p(i)$ into the A register, or
        (d2) if the symbol a is the symbol $a_m$, by subtracting the value $K*S(i)$ from the contents of the A register;
    (e) shifting both the A register and the C register in a predetermined direction until the contents of the A register lie within a predetermined range, filling the vacated positions with zeros; and
    (f) if the symbol $a_i$ is not the last symbol in string STR, repeating steps (b)—(e) or, if the symbol $a_i$ is the last symbol in string STR, shifting the contents of the C register by ω positions in said predetermined direction;
    whereby the sequence of binary digits shifted out of the C register constitutes said compressed representation R(comp) of the symbol string STR.

3. The method according to claim 2, wherein said predetermined binary one digit is the second most significant binary one digit in the A register, such that the scaling factor K comprises at most two binary one digits separated by z zero digits.

4. The method according to claim 2, wherein said predetermined value is 1.000.

5. The method according to claim 3, wherein said method further includes the step of:
    providing the value $K*p(i)$ or $K*S(i)$, respectively, by shifting the value p(i) or S(i), respectively, through z+1 positions towards less significant positions, and adding the shifted quantity to the available value p(i) or S(i), respectively.

6. The method according to claim 2, wherein the predetermined range is from 1.0 (binary) to 1.111 . . . (binary) and the predetermined direction is such as to increase the magnitude of the contents of the A register.

7. In a method of decoding a compressed representation R(comp) of a source data string STR, wherein:

each symbol is taken from a finite set of $m+1$ symbols $a_0 \ldots a_m$, said compressed representation being a numeric value within a given range, a probability value $p(i)$ and a cumulative probability value $S(i)$ being available for each symbol $a_i$, said cumulative probability value being $$S(i) = p(0) + p(1) + \ldots + p(i-1) \text{ for } i = 1 \ldots m.$$
$$S(0) = 0,$$

and using a pair of shift registers A and C each comprising $\omega$ binary digit positions, the improvement comprising the steps of:

(a) initially setting the contents of the C register to the $\omega$ most significant digits of the compressed representation R(comp), and the contents of the A register to a predetermined value; and decoding each successive symbol $a_j$ in the source data string STR by:

(b) determining a scaling factor K by taking the contents of the A register and eliminating all binary digits less significant than a predetermined binary one digit;

(c) determining the largest value of j such that $C \geq K*S(j)$, where C is interpreted as a binary fraction with a binary point outside the C register adjacent to the most significant binary digit therein, and $a_j$ is the symbol output by the decoder at the current step;

(d) determining the contents of the A register (d1) if the symbol $a_j$ is not the symbol $a_m$ by inserting the value $K*p(j)$ into the A register, or (d2) if the symbol $a_j$ is the symbol $a_m$, by subtracting the value $K*S(j)$ from the contents of the A register;

(e) subtracting the value $K*S(j)$ from the contents of the C register;

(f) shifting both the A register and the C register in a predetermined direction until the contents of the A register lie within a predetermined range, filling the vacated positions in the A register with zeros and filling the vacated positions in the C register with the corresponding number of most significant digits remaining in the compressed representation R(comp), and repeating steps (b)—(f) until R(comp) is empty.

8. The method according to claim 7, wherein said predetermined binary one digit is the second most significant binary one digit in the A register, such that the scaling factor K comprises at most two binary one digits separated by z zero digits.

9. The method according to claim 8, further including the step of:

providing the value $K*p(i)$ or $K*S(i)$, respectively, by shifting the value $p(i)$ or $S(i)$, respectively, through $z+1$ positions towards less significant positions, and adding the shifted quantity to the available value $p(i)$ or $S(i)$, respectively.

10. The method according to claim 7, wherein the predetermined value is 1.0000 . . . (binary).

11. The method according to claim 7, wherein the predetermined range is from 1.0 (binary) to 1.111 . . . (binary) and the predetermined direction is such as to increase the magnitude of the contents of the A register.

* * * * *

UNITED STATES PATENT AND TRADEMARK OFFICE
CERTIFICATE OF CORRECTION

PATENT NO. : 4,989,000

DATED : January 29, 1991

INVENTOR(S) : D. S. Chevion, et al.

It is certified that error appears in the above-identified patent and that said Letters Patent is hereby corrected as shown below:

On Title page, of patent please add assignee information as follows:

Assignee:   International Business Machines Corporation, Armonk, N.Y.

Signed and Sealed this

Fifteenth Day of June, 1993

Attest:

MICHAEL K. KIRK

*Attesting Officer*      *Acting Commissioner of Patents and Trademarks*